(12) United States Patent
Vivien et al.

(10) Patent No.: US 9,568,671 B2
(45) Date of Patent: Feb. 14, 2017

(54) NANOTUBE ELECTRO-OPTICAL COMPONENT, OPTRONIC OR OPTICAL LINK-BASED HYBRID INTEGRATED CIRCUIT INTEGRATING THIS COMPONENT, AND METHOD OF FABRICATION

(75) Inventors: Laurent Vivien, Vauhallan (FR); Etienne Gaufres, Montreal (CA); Nicolas Izard, Palaiseau (FR)

(73) Assignees: UNIVERSITE PARIS SUD 11, Orsay (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 829 days.

(21) Appl. No.: 13/704,452

(22) PCT Filed: Jun. 15, 2011

(86) PCT No.: PCT/FR2011/051355
§ 371 (c)(1),
(2), (4) Date: Apr. 15, 2013

(87) PCT Pub. No.: WO2011/157948
PCT Pub. Date: Dec. 22, 2011

(65) Prior Publication Data
US 2013/0216178 A1    Aug. 22, 2013

(30) Foreign Application Priority Data

Jun. 15, 2010   (FR) ...................................... 10 54744

(51) Int. Cl.
*G02B 6/12* (2006.01)
*H01L 21/302* (2006.01)
(Continued)

(52) U.S. Cl.
CPC ................. *G02B 6/12* (2013.01); *B82Y 10/00* (2013.01); *B82Y 30/00* (2013.01); *G02F 1/065* (2013.01);
(Continued)

(58) Field of Classification Search
CPC ......... H04B 10/505; G02B 6/12; G02B 6/136; G02B 6/4201; B82Y 30/00; B82Y 10/00; B82Y 20/00; H01L 21/302; H01L 51/0048; H01L 51/428; Y02E 10/549; Y02P 70/521
(Continued)

(56) References Cited

U.S. PATENT DOCUMENTS

| 2005/0243410 A1 | 11/2005 | Bachmann et al. |
| 2005/0249249 A1 | 11/2005 | Pettit |

(Continued)

FOREIGN PATENT DOCUMENTS

| JP | 2007 072112 | 3/2007 | |
| JP | WO 2011/135978 | * 11/2011 | ............. H01L 33/04 |

OTHER PUBLICATIONS

E. Adam et al., Electroluminescence from Single-Wall Carbon Nanotube Network Transistors, Nano Letters, vol. 8, No. 8, 2008, pp. 2351-2355.*

(Continued)

*Primary Examiner* — Akm Enayet Ullah
*Assistant Examiner* — Michael Mooney
(74) *Attorney, Agent, or Firm* — Greer, Burns & Crain, Ltd.

(57) ABSTRACT

A photonic component is provided including at least one linear optical waveguide, of which an active portion is surrounded over all or part of its periphery by a grouping of one or more essentially semiconducting nanotubes. These nanotubes interact with their exterior environment in an active zone extending on either side of the optical wave- (Continued)

guide, to thus induce an optical coupling between an electrical or optical signal applied to the nanotubes and on the other hand an optical signal in the active portion of the waveguide. Such a component can carry out bipolar electro-optical functions as light source, or modulator or detector, inside the optical guide, for example with an electro-optical coupling between on the one hand an electrical signal applied between the electrodes, and on the other hand an optical signal emitted or modified in the active portion of the optical waveguide towards the remainder of the optical guide.

20 Claims, 5 Drawing Sheets

(51) Int. Cl.
| | |
|---|---|
| H01S 5/50 | (2006.01) |
| B82Y 10/00 | (2011.01) |
| B82Y 30/00 | (2011.01) |
| G02F 1/065 | (2006.01) |
| H01L 51/42 | (2006.01) |
| H01L 51/00 | (2006.01) |
| B82Y 20/00 | (2011.01) |

(52) U.S. Cl.
CPC .......... *H01L 21/302* (2013.01); *H01L 51/428* (2013.01); *H01S 5/50* (2013.01); *B82Y 20/00* (2013.01); *H01L 51/0048* (2013.01); *Y02E 10/549* (2013.01); *Y02P 70/521* (2015.11)

(58) Field of Classification Search
USPC ...... 385/1–3, 14, 40, 43, 129–132; 977/734, 977/742, 750, 842; 257/10, 12, 24, 257/E29.005, E51.04; 438/31, 585, 586, 438/595; 359/333; 216/24
See application file for complete search history.

(56) References Cited

U.S. PATENT DOCUMENTS

| | | | |
|---|---|---|---|
| 2006/0158760 A1 | 7/2006 | Portico Ambrosio et al. | |
| 2008/0036356 A1* | 2/2008 | Ward | B82Y 10/00 313/341 |
| 2008/0296563 A1* | 12/2008 | Bourgoin | B82Y 10/00 257/40 |
| 2009/0189143 A1* | 7/2009 | Kastalsky | B82Y 10/00 257/12 |
| 2009/0268765 A1* | 10/2009 | Mahgerefteh | H01S 5/0265 372/28 |

OTHER PUBLICATIONS

Phaedon Avouris et al., "Carbon-Nanotube Photonics and Optoelctronics", Nature Photonics, vol. 2, Jun. 2006, pp. 341-350.*
In-Kag Hwang et al., "Optimization of Coupling Between Photonic Crystal Resonator and Curved Microfiber" IEEE Journal of Quantum Electronics, vol. 42, No. 2, Feb. 2006, pp. 131-136.
Vasili Perebeinos et al., "Exciton Ionization, Franz-Keldysh, and Stark Effects in Carbon Nanotubes", Nano Letters, vol. 7, No. 3, 2007, pp. 609-613.
Phaedon Avouris et al., "Progress in Carbon Nanotube Electronics and Photonics", MRS Bulletin, vol. 35, Apr. 2010, pp. 306-313.
Phaedon Avouris, "Carbon Nanotube Electronics and Photonics", Physics Today, Jan. 2009, pp. 34-40.
Shinji Yamashita, "Applications of Carbon Nanotube to Photonics", Optical Internet (Coin), IEEE 9th International Conference, Piscataway, NJ, Jul. 11, 2010, pp. 1-3.
Ronald Pirich et al., "Copper, Fiber-Optic and Carbon Nanotube Technologies for Next Generation Military Information Systems", IEEE Application and Technology Conference (LISAT), Long Island Systems, May 7, 2010, pp. 1-5.
Marcel W. Pruessner et al., "Integrated Waveguide Fabry-Perot Microcavities with Silicon/Air Bragg Mirrors", Optics Letters, vol. 32, No. 5, Mar. 1, 2007, pp. 533-535.
Etienne Gaufres et al., "Optical Gain in Carbon Nanotubes", Applied Physics Letters, vol. 96, 2010, pp. 231105, 1-3.
Ken Kashiwagi et al., "All Optical Switching Using Carbon Nanotubes Loaded Planar Waveguide", IEEE Lasers and Electro-Optics and Quantum Electronics and Laser Science Conference, Piscataway, NJ, May 21, 2006, pp. 1-2.
Ken Kashiwagi et al., "Deposition of Carbon Nanotubes Around Microfiber via Evanascent Light", Optics Express, vol. 17, No. 20, Sep. 28, 2009, pp. 18364-18370.
Julien Borghetti et al., "Optoelectronic Switch and Memory Devices Based on Polymer Functionalized Carbon Nanotube Transistors", Trends in Nanotechnology Conference Proceedings, Sep. 4, 2006, pp. 1-2.
Thomas Mueller et al., "Efficient Narrow-Band Light Emission from a Single Carbon Nanotube p-n Diode", Nature Nanotechnology, Nov. 15, 2009, pp. 319 1-3.
Mathias Steiner et al., "Carbon Nanotubes and Optical Confinement—Controlling Light Emission in Nanophotonic Devices", Proc. of SPIE, vol. 7037, 2008, pp. 703713 1-9.
Fengnian Xia et al., "A Microcavity-Controlled, Current-Driven, On-Chip Nanotube Emitter at Infrared Wavelengths", Nature Nanotechnology, vol. 3, Oct. 2008, pp. 609-613.

* cited by examiner

NANOTUBE ELECTRO-OPTICAL COMPONENT, OPTRONIC OR OPTICAL LINK-BASED HYBRID INTEGRATED CIRCUIT INTEGRATING THIS COMPONENT, AND METHOD OF FABRICATION

BACKGROUND

The present invention relates to a photonic component comprising at least one linear optical waveguide, a so-called active portion of which is surrounded over all or part of its periphery by a group of one or more essentially semiconducting nanotubes. These nanotubes interact with their external environment in an active zone extending on either side of the optical waveguide, so as to thus induce an optical coupling between an electrical or optical signal applied to the nanotubes and on the other hand an optical signal in the active portion of the waveguide. Such a component can carry out in particular bipolar electro-optical functions as light source, or modulator or detector, inside the optical guide, for example with an electro-optical coupling between on the one hand an electrical signal applied between the electrodes, and on the other hand an optical signal emitted or modified in the active portion of the optical waveguide towards the remainder of said optical guide.

It also relates to an electronic and optical hybrid integrated circuit the optical and electronic circuits of which interact with each other through at least one such electro-optical component; as well as to a method for the production of such a component or integrated circuit.

The invention relates to the field of nanophotonics and optoelectronics for various applications: for example optical interconnections in future integrated circuits, optical telecommunications, biophotonics, labs-on-a-chip, etc.

Components

Numerous systems use optical circuits in order to process or transmit digital data, for example for telecommunications or in computer equipment. So-called electro-optical or optronic components are used to generate information in these optical circuits and allow them to interact with electronic circuits.

These components include different types and in particular light sources, detectors, and modulators.

Such a light source uses electrical energy to produce a light, coherent (laser) or not, which can be injected into an optical waveguide to supply an optical circuit. Nowadays such light sources are often made of type III-V semiconductor materials.

An electro-optical modulator receives an electrical signal and acts on a light flux in order to modulate it as a function of the electrical signal and thus provide a light signal, for example in order to convert an electrical telecommunication signal into an optical signal which is injected into a long-distance or even transoceanic optical telecommunication fibre. Nowadays such modulators are often made of III-V semiconductor.

Such a detector receives a light flux or signal, and produces an electrical signal as a function of the light signal received, for example in order to decode an optical signal received from an optical fibre and convert it into an electrical signal which can be processed by a computer. Nowadays such detectors are often produced based on germanium or InGaAs.

A greater compactness of the circuits and components is useful for increasing the density of the circuits and therefore the miniaturization and/or the performance of the equipment that they make it possible to produce.

It is useful to be able to integrate together as many components and/or sub-assemblies as possible. This makes it possible for example to reduce the costs, but also to increase the density and the miniaturization of the circuits, and to reduce the interfaces between blocks and reduce consumption and heating of the circuits obtained.

Optical and Electronic Hybrid Integrated Circuits

Optical or optoelectronic integrated circuits are increasingly used in numerous fields.

For example, they are a possible solution to the limitations increasingly affecting the development of purely electronic components which exhibit constraints proving increasingly problematic and sometimes insurmountable.

In fact, as the density of integration of the components increases as the size of the transistors decreases, the interconnections are increasingly complex, and existing circuits possess more than 12 metal/dielectric levels used to produce communication channels between different sets of transistors within the same integrated circuit.

In a few years from now, it can be foreseen that the performances of the integrated circuits will be limited due to the growing complexity of these connection circuits. This limitation will in particular affect metal interconnections, for example due to the time constant associated with the resistive and capacitive values of these connections, or due to the skin effect in the conductors which will accentuate these limitations at high frequency causing increasing distortion of the signals and an increase in the propagation delays. The overall links within an integrated circuit, such as the connections between blocks and the distribution of the clock signal, are among the first affected by these limitations.

Solutions are sought for pushing back these limits in existing technologies by the introduction of conductors having less resistivity and materials having a lower dielectric constant, or by introducing repeaters placed regularly along the connection lines. These solutions are however term-limited, and can moreover increase the space requirement of the circuits as well as their electricity consumption and therefore their heating.

One type of solution proposed consists of using optical interconnections, which provides a certain number of advantages:

Performances are virtually independent of the length of the interconnections;
Propagation is not very dependent on the signal frequency;
The repeaters are not necessary which results in a saving in space and in dissipated power;
Distribution does not generate noise towards the remainder of the chip;
It is possible to use several wavelengths on the same channel: wavelength multiplexing.

The utilization of such optical interconnections involves the integration of electro-optical components within electronic integrated circuits, such as sources, modulators and light-signal detectors. The solution currently envisaged in order to be compatible with CMOS circuits technology is to guide the light in the silicon film of a silicon-on-insulator (SOI) substrate, to modulate the light using silicon- or SiGe-based modulators, to detect it using germanium and to emit the light using mainly III-V semiconductors.

The internal high frequency optical link in an integrated circuit on silicon currently considered in the profession is thus mainly made up of three materials: silicon, germanium and III-V.

However, such an optical link structure requires very heterogeneous integration as regards the materials and manufacturing processes used as well as in terms of design and internal organization of the integrated circuit. This heterogeneity has numerous drawbacks for example and in particular as regards design flexibility and manufacturing simplicity with a limiting factor as regards the source based on III-V semiconductor which does not use the same substrate dimensions.

Moreover, these current architectures of electro-optical components limit their miniaturization, for example due to the necessary interaction lengths within optical guides which are sometimes several millimeters.

These architectures and the stringent accuracy requirements that they involve, as well as the differences in materials that they use, make the integration of these components within integrated circuits complex and expensive. This limits in particular the possibilities of hybrid integration combining optical integrated circuits and electronic integrated circuits together within the same "chip" or integrated circuit.

Use of Nanotubes

Studies of nanotubes have shown that these materials can have certain semiconductor-type properties due to their nanometric scale, and their one-dimensional nature.

Thus, the publication "Electroluminescence from Single-Wall Carbon Nanotube Network Transistors" by Adam et al. in NanoLetters 2008, 8 (8) 2351-2355, presents a multidirectional electroluminescent effect obtained in a field-effect transistor produced by applying an electric field between several successive parallel electrodes arranged across a track constituted either by a single nanotube (CNFET), or by a unorganized network of several nanotubes (NNFET).

In the publications "Carbon Nanotubes and Optical Confinement—Controlling Light Emission in Nanophotonic Devices" by Steiner et al. in SPIE 2008 Vol. 703713 703713, and "A microcavity-controlled, current-driven, on-chip nanotube emitter at infrared wavelengths" by Fengnian et al. in Nature Nanotechnology Vol. 3 Oct. 2008, it has been proposed to capture such an electroluminescent effect using an optical "amplification" microcavity.

As illustrated below in FIG. 1, this microcavity is formed by two mirrors surrounding an assembly constituted by a layer of $SiO_2$ supporting a layer of PMMA between two side electrodes which are linked to each other by a single nanotube embedded in the PMMA. This cavity is mounted on a layer of P+ doped silicon in order to form a field-effect transistor (FET) producing a light which is captured and amplified by the cavity and re-exits from it perpendicularly to the different superimposed layers.

Similarly, according to the publication "Efficient narrow-band light emission from a single carbon nanotube p-n diode" by Müller et al. in Nature Nanotechnology Letters of November 2009 (DOI: 10.1038/nnano.2009.319), the emission is produced by an individual nanotube mounted in a diode between two zones of electrodes and subjected to an electric field above an optical microcavity.

This prior art describes only light production elements which also have certain drawbacks. Thus, the intensity emitted by these elements is rather low, and is not directional. The microcavity can make it possible to obtain a directional source, but at the price of additional complexity which is likely to impose problematic constraints, in particular for integration. Moreover, the injection of this light into an optical waveguide requires additional adjustments not yet addressed which are themselves also sources of additional complexities, perhaps also of losses in yield or light intensity. These complexities, as well as the direction of emission perpendicular to the layers of the cavity, make any attempt at integration of such components within an optical circuit more complex and difficult, and even more so within a hybrid integrated circuit.

Similarly, a coupling described in the document US 2005/249249 consists of injecting a light produced by a nanotube mounted in an FET transistor into the end of an optical fibre, through a lens arranged on the optical axis of this fibre; or enclosing this nanotube within this optical fibre. Such an assembly however yields little light and is difficult and cumbersome to produce and to adjust, and is ill-suited for use in an integrated circuit.

Generally, a tendency in the state of the art is to use nanotubes for their semiconductor properties. Thus, everything is done to seek to obtain isolated nanotubes, for example a sonic separation in order to avoid bundles of nanotubes, followed by a technique of individual coating with a surfactant product. Such an individual nanotube can then be arranged on a substrate which makes it possible to ensure an electric contact at both its ends by covering the latter with conducting layers forming electrodes.

SUMMARY

A purpose of the invention is to remedy the drawbacks of the state of the art, and in particular to allow:
  a stronger light intensity and with a higher density,
  an easier and more efficient interaction of the light effects with the optical waveguide or waveguides;
  better possibilities of miniaturization and integration of the components in optical circuits;
  better possibilities of integration in hybrid integrated circuits combining optical and electronic circuits;
  a good compromise between performance and heating of the circuits obtained;
  a certain simplification of the materials used, in terms of number and environmental and supply constraints;
  a certain standardization of the manufacturing processes and technologies;
  a simplicity of implementation and a limitation of the accuracy requirements during manufacture;
  good compatibility with existing integrated electronic circuit manufacturing technologies and in particular with CMOS technology.

The invention, in most of the embodiments presented here, is based on the fact of using nanotubes also as multi-dimensional (two-dimensional or three-dimensional) semiconductor material, without necessarily seeking to identify, process or locate each nanotube individually. It could be said that it is no longer a matter of using a nanotube as an individual object, but also as a unitary element within a material which can be measured and fashioned: applied here in the form of a bundle or "group" of nanotubes, which could be described as a "patch". For example in modulator-type embodiments, the invention proposes using an accumulation of non-aligned nanotubes as a three-dimensional volume of material, in the same way as if it were a non-organized or only slightly organized material. Similarly, in emitter- and/ or detector-type embodiments, the invention proposes using an accumulation of nanotubes as a three-dimensional volume of material in which a predominantly unidirectional orientation is obtained.

Component and Integrated Circuit

In this spirit, the invention proposes a photonic component comprising at least one linear optical waveguide, a so-called active portion of which is surrounded over all or part of its periphery by a group of one or more essentially semiconducting nanotubes.

These nanotubes interact with their external environment in a so-called active zone extending on either side of this active portion of the optical waveguide, thus inducing at least one optical coupling between:
- on the one hand an electrical or optical signal applied to the nanotubes from their environment or returned by them to this environment, in said active zone, and
- on the other hand an optical signal emitted or respectively received in said active portion of the optical waveguide.

More particularly, the invention proposes a photonic component comprising at least one linear optical waveguide made of silicon or silicon nitride, a so-called active integrated portion of which is surrounded over all or part of its periphery by a group of one or more essentially semiconducting nanotubes which interact electrically in a so-called active zone extending on either side of said active portion of the optical waveguide, with at least two electrodes arranged on either side of said active portion, thus inducing an electro-optical coupling between
- on the one hand an electrical signal applied between said electrodes, and
- on the other hand an optical signal emitted or modified in said active portion of the optical waveguide towards the remainder of said optical guide.

The use of an integrated optical guide in silicon and/or in silicon nitride is particularly useful, for example as it makes it possible to simplify, standardize and/or homogenize the stages of manufacture of hybrid circuits comprising other regions of the same material, for example electronic circuits and/or photonic crystals.

The active portion of the optical guide is closely and preferably contiguously surrounded. Typically, it is a group of nanotubes directly in contact with the guide, or in indirect contact through a layer which is not very thick relative to the dimensions of the optical mode which is the object of the coupling in this guide.

In fact, the inventors found that such a group of nanotubes was able to provide an optical coupling with the inside of an optical guide even while being situated outside the guide and outside its linear propagation axis, i.e. the nanotubes can be situated outside the guide, on its sides. The nanotubes generate, modify or detect an optical signal directly within the guide and through its walls. This involves a direct coupling through the walls of the guide, unlike the state of the art in which each nanotube is seen in itself as a source the light of which must be amplified then injected into the guide through its end.

Optionally, this optical waveguide itself can moreover comprise, in its active portion, an optical light signal amplification structure, for example a Fabry Perot cavity or a photonic crystal. It should be noted that the group of nanotubes in this case can also surround the amplification structure in the same way as the optical guide.

Preferably, the group of nanotubes comprises a plurality of nanotubes, for example agglomerated together, naturally or with a binder, for example gel or solid. These nanotubes are arranged together in the form of a powder, and form between the electrodes a sheet or a substantially flat thin layer enclosing the active portion of the optical waveguide or in contact therewith. The electrodes are situated for example at the surface of this layer, or at the ends of the part of this layer having to form the active part.

In embodiments of the invention that can be described as optical-optical, the group of nanotubes can be excited by a light signal or an external light flux. It will then produce an optical coupling with the inside of the guide by the phenomenon of optoluminescence which consists of generating, for the nanotubes, a light flux situated within an optical mode internal to the guide, whereas the light excitation that they receive is external to the guide. It can for example be a matter of producing a component capable of inserting a light signal arriving in any manner into one or more optical guides.

According to another family of embodiments, the invention also proposes such a component forming an electro-optical component in which one or more nanotubes in the group of nanotubes interact electrically with at least two electrodes arranged on either side of the active portion of the optical waveguide. An electro-optical coupling is thus induced between:
- on the one hand, an electrical signal applied or respectively detected between said electrodes, and
- on the other hand, an optical signal emitted or respectively received in said active portion of the optical waveguide.

Preferably, the electrical signal is applied or detected by at least two complementary electrodes, for example of opposite sign, situated around the active portion and on either side of the optical waveguide, so as to generate between them an electric field or current substantially transversal to the longitudinal axis of the optical guide. Typically, these electrodes can be parallel to each other and to the longitudinal axis of the optical guide.

In a variant, the electrodes can be arranged around the active portion so as to have between them a gap extending along the optical waveguide, and thus to generate between them an electric field or an electric current substantially parallel to the longitudinal axis of said optical guide.

In certain embodiments, the electrodes interact with the nanotubes of the group without electrical connection with these nanotubes by creating an electric field within these nanotubes. This electric field then causes in these nanotubes a Kerr effect and/or a Stark effect which absorbs all or part of a light flux circulating in the active portion of the optical waveguide.

This absorption can be obtained for example by the electro-absorption phenomenon. It can also be obtained by a Kerr electro-refraction effect and/or a Stark effect with an absorption peak shift in the active portion of the optical waveguide which is for example introduced into an interferometer (Mach Zehnder, resonator) in order to convert the phase modulation or absorption shift to intensity modulation.

The invention thus makes it possible to carry out a modulation of a light flux circulating in this active portion of the optical waveguide, as a function of a voltage or of an electrical signal received and applied to the electrodes.

In certain so-called aligned embodiments, the component comprises a so-called alignment zone, including the active portion of the optical guide and all or part of the active zone, and in which the nanotubes in the group of nanotubes are mostly aligned in a same direction.

These aligned embodiments make it possible to improve the efficiency of such active structures, for example for a modulator described above.

According to a feature, in so-called connected embodiments, all or most of the nanotubes in the majority alignment zone are moreover each connected to both electrodes.

By applying a voltage or an electrical signal to these electrodes, an injection of carriers of charge, holes or electrons is thus created in these connected nanotubes, causing the electroluminescence phenomenon which is an emission of a light flux within an optical mode including all or part of the active portion of the optical waveguide.

The invention thus makes it possible to produce a light source within this optical guide, by creating a longitudinal light flux from the signal or from the voltage applied to the electrodes.

It should be noted that the use of a configuration with nanotubes connected to the electrodes does not prevent the production of an electric field between the electrodes, for example due to the resistivity of the nanotubes. This "connected" configuration can therefore be compatible with an implementation as a electric field modulator, for example in order to simplify the manufacturing process by simultaneously aligning several close active regions intended for different roles, or by using the same active region successively in two different roles such as source and modulator.

In a reverse use, the passage of a flux or of a light signal within the active portion of the optical waveguide will, by absorption by the group of nanotubes, cause a difference in voltage and/or a current within these connected nanotubes. These nanotubes then produce photocurrent and/or photovoltage at the electrode terminals.

It is thus possible to produce an electric detector sending an electrical signal as a function of the flux or of the light signal which passes through this optical waveguide.

Moreover, it should be noted that the same component can be used successively in both roles which increases the design flexibility and improves the compactness of the circuits and devices in which it is used.

The invention thus makes it possible to carry out functions of generation, modulation or detection of a light flux or of an optical signal in an optical guide with a light intensity of a good or even improved level, and according to a better compactness allowing a greater density on an integrated circuit and/or in an optronic or photonic device.

The interaction of the coupling with one or more linear optical guides is facilitated and of a better yield due to the positioning of the nanotubes around the periphery of this guide, inter alia because this makes it possible to arrange all of the elements of the component only in the two dimensions of an integrated circuit a few layers thick.

These performances in terms of compactness, simplicity and yield of the coupling allow better possibilities of miniaturization and integration of the components in integrated circuits, whether optical or electronic. They also allow a better compromise between the performance and the heating of the circuits obtained.

It should be noted that a feature of the invention is the possibility of using an applied or detected electrical signal within a group of nanotubes, perhaps a bipolar signal, which may most often require only two electrodes.

This bipolar electrical signal can be applied, for example by producing an electric field in a non-connected configuration, but also in a configuration with connected nanotubes using two electrodes of different metals chosen in order to obtain an injection of $e^-$ and $h^+$ charge carriers.

This represents an advantage in terms of simplicity and compactness relative to the different devices of the state of the art operating as a three-terminal FET transistor, or PN diode additionally requiring the maintenance of an electric field i.e. four terminals in total.

According to a feature of the invention, such a component comprises a plurality of optical waveguides, for example completely independent or different active parts of the same optical guide, which are completely or partly coated with nanotubes within the same group of nanotubes. These optical waveguides interact independently of each other, each with at least two electrodes which determine a plurality of independent active zones thus producing a plurality of components according to the invention. These components are functionally independent of each other while using the same group of nanotubes.

These different active zones can be separated for example by a distance of at least 5 or even 10 or 15 micron. Furthermore, the group can be produced or treated so as to be aligned or even connected in certain active zones, and not aligned and not connected in others.

According to another feature of the invention, such an electro-optical component can also be integrated both in an electronic circuit and in an optical integrated circuit, which integrated electronic and optical circuits interact with each other through said electro-optical component.

It will be noted that these different characteristics can be fully combined with each other. According to an aspect thus allowing an additional synergy, the invention thus proposes an integrated, i.e. also hybrid, electronic and optical circuit comprising at least one optical circuit and at least one electronic circuit which interact with each other through one or more electro-optical components according to the invention. This or these electro-optical components are then integrated in both this optical circuit and in this electronic circuit.

The invention thus makes possible the simple and compact production of an integrated electronic circuit with integrated internal optical distribution. Such a hybrid integrated circuit comprises for example a plurality of electronic assemblies communicating with each other by optical signals routed through one or more optical integrated circuits within the hybrid integrated circuit. Inside the hybrid integrated circuit, each of these different electronic assemblies interacts with these optical signals using at least one electro-optical component according to the invention.

Such a hybrid circuit in particular allows extremely rapid communication between the different electronic assemblies, at frequencies difficult to achieve in electronic signals and without the drawbacks and constraints linked to such high frequencies in electronics, for example interferences with close components or with external electric fields.

Due in particular to the compactness of the different electro-optical components according to the invention, the design and manufacture are rendered simpler and allow a better compactness and density, in particular in the hybrid integrated circuits integrating assemblies and/or optical and electronic circuits together.

Moreover, due to the use of the same type of semiconductor material for the different functions, source or modulator or detector, the invention allows a simplification of the materials used, in terms of number and environmental and supply constraints; as well as a standardization of the manufacturing processes and technologies.

The nature of the structures and the characteristics of the components allow in particular a simplicity of implementation and a limitation or even a reduction in the accuracy requirements linked to the different materials used during manufacture. Moreover, a reduction in the number of technological stages is envisaged thanks to the use of a single material.

It should be noted that the different types of functionalities can be combined with different types of structures of the group of nanotubes, and with positioning of the guide on the substrate, as well as with the different arrangements of electrodes: longitudinal but also transversal and at different intermediate angles.

In the component according to the invention, the optical guide can be for example made of silicon or silicon nitride and the group of nanotubes comprises mostly carbon nanotubes, for example of single-wall type (SWCT).

The length of the active optical guide portion can be of the order of a few tens of nanometers, for example between 10 and 100 nanometers, or even between 20 and 50 nanometers.

The electrodes can be separated by a distance of between 1 and 10 micrometers, and preferably between 2 and 6 micrometers.

If possible a group of nanotubes free of metal nanotubes will be implanted, and preferably with less than 1% or even 2% metal nanotubes for a source of light and less than 10% or even 15% for a detector or a modulator.

The thickness of the group of nanotubes is preferably greater than a monolayer of nanotubes from one thickness up to approximately 2 μm, or even between 600 nm and 1 μm, The novelty is partly based on use of the same carbon nanotubes for the production of a source, a modulator and a photodetector, in order to arrive at the production of a complete high frequency optical link for optical interconnections or optical telecommunications. In the invention, the nanotubes are used as an active medium and can be integrated in waveguides made of silicon, polymer or any other material.

Important advantages, regarding heterogeneous technologies on a silicon platform, are use of the same type of material for the source, modulation and detection; and possibly with a single chirality of carbon nanotubes. This results in a simplification of the technology implemented as the same process stages are used for all the basic components. Furthermore, this technology will be compatible with future technologies developed for microelectronics.

Production Method

Against this same background, the invention also proposes a method for producing a component according to the invention, and more particularly an electro-optical component or integrated circuit as described here.

According to the invention, this method comprises, at least for the production of an electro-optical coupling between at least one optical waveguide and one or more nanotubes:
  creation of at least one region forming a group of one or more nanotubes, coating at least one portion of optical waveguide and interacting electrically with at least two electrodes situated on either side of said portion of optical waveguide; or
  creation of at least one portion of optical waveguide completely or partly coated by at least one region forming a group of one or more nanotubes interacting electrically with at least two electrodes situated on either side of said portion of optical waveguide; or
  a combination of these two operations.

According to a feature, the creation operation can comprise the following steps:
  etching or deposition forming at least one optical guide made of silicon or silicon nitride, for example on a silica or SOI substrate;
  optionally, an underetching of the substrate under the active part of the guide which will allow a better envelopment of the guide by the group of nanotubes;
  deposition of a region forming a group, being able to form for example a "patch" of one or more nanotubes of semiconductor type (for example one or more nanotubes inserted into a liquid or a gel or a polymer), so that this group or this patch surrounds all or part of the periphery of at least one so-called active portion of this optical waveguide;
  etching or deposition of electrodes surrounding this active portion of the optical waveguide on either side and arranged so as to interact electrically with the nanotubes surrounding this active portion.

For the aligned embodiments, the alignment can be carried out for example during the deposition of the nanotubes for example by dielectrophoresis, by subjecting the deposition region to an electric field during the deposition, for example by temporary or prior electrodes. The direction of this electric field during the deposition will then determine a direction of alignment for the nanotubes deposited.

For the connected embodiments, the method according to the invention also comprises a step of etching or cutting of this group of nanotubes in two cutting regions distributed on either side of the active portion of the optical waveguide. In this step, these cutting regions are arranged to cut a same plurality of nanotubes within this group.

This step of etching or cutting of the cutting regions is preferably situated between a step of deposition of aligned nanotubes and a step of creation of the electrodes.

The subsequent step of creation of the electrodes then comprises a deposition or a growth of these electrodes within these cutting regions, so as to electrically connect these electrodes to the two ends of a same plurality of nanotubes in the group of nanotubes.

According to another feature of the method for producing electro-optical components the creation operation can comprise the following steps:
  etching or deposition (in any order), on the one hand, of material forming at least one optical guide made of silicon or silicon nitride, for example on a silica or SOI substrate and, on the other hand, of electrodes surrounding a so-called active portion of the optical waveguide on either side;
  deposition of a group of nanotubes of semiconductor type, being able to form for example a "patch", of one or more nanotubes of semiconductor type (for example one or more nanotubes inserted into a liquid or a gel or a polymer), so that these nanotubes coat all or part of the periphery of at least this active portion of the optical waveguide and are arranged to interact electrically with these electrodes.

Optionally, the method can also comprise a step of underetching of the substrate or of the layer situated under the optical waveguide, carried out at the level of the active portion so as to allow the group of nanotubes to coat the lower part of said optical waveguide. This underetching is particularly useful for the non-aligned nanotubes which can thus invade the underetching space. It can however also be useful for the aligned nanotubes, for example to facilitate the establishment of an optical mode coupling zone surrounding the optical guide as much as possible.

According to a feature which can be combined with all the others, the method according to the invention can also comprise a step of producing at least one monobloc region forming a group of nanotubes, followed by one or more operations of producing a plurality of components according to the invention which are functionally independent (or even of different types) and produced within the same group of nanotubes.

It is thus possible to simplify manufacture and improve compactness by using the same region of nanotubes deposited once only and in a single region, for several components.

According to another aspect of the invention, the method for producing an optoelectronic hybrid integrated circuit can comprise on the one hand the production of at least one electronic circuit and on the other hand the production of at least one optical circuit within the same integrated circuit. This method then also comprises at least one step of producing at least one electro-optical component according to the invention, integrated in both this electronic circuit and this optical circuit.

Optionally, the production method according to the invention can comprise or follow a phase of purification of the nanotubes, for example by known methods, in order to selectively obtain nanotubes of a specific and/or non-metal type winding index (n, m) in the group of semiconductor nanotubes carrying out the coupling with the active portion of the optical waveguide.

This phase of purification of the nanotubes used can comprise for example a step of selective extraction by polymer, in particular by PFO and with centrifugation.

Advantageously, the method according to the invention can also comprise a control of the optical wavelength of the optical or electro-optical coupling by the choice of the winding index (n, m) of the nanotubes of the coupling, also called the chirality index: (n, m) indicating the winding and the diameter respectively.

By way of example, starting with nanotubes of HiPCO type supplied by Unidym, an index (8.6) will be used in order to generate, modulate or detect an optical signal with a wavelength of 1.2 micrometer; and an index (8.7) for a wavelength of 1.3 micrometer.

Various embodiments of the invention are provided, integrating the different optional characteristics disclosed here in all of their possible combinations.

BRIEF DESCRIPTION OF THE DRAWINGS

Other characteristics and advantages of the invention will become apparent from the detailed description of an embodiment which is in no way limitative, and the attached drawings in which:

FIG. 9: with optical guide between two successive layers of nanotubes,

FIG. 10: with optical guide embedded in a lower layer and covered with a volume of nanotubes, FIG. 11: with optical guide comprising two individual optical guides coupled to each other;

DETAILED DESCRIPTION

Figure 1:
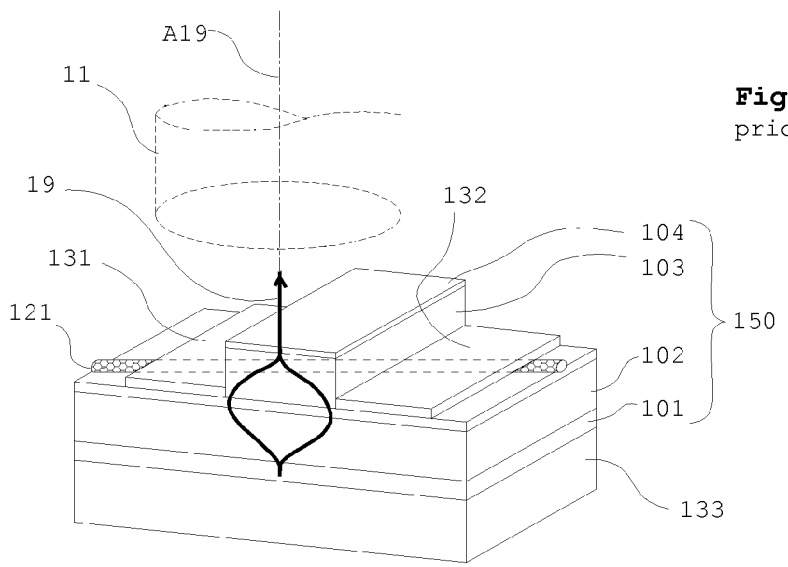
FIG. 1 illustrates a state-of-the-art field-effect transistor with a single nanotube and microcavity in the input axis of a linear optical guide.

The FIG. 1 illustrates the state of the art as described in the publication Fengnian et al. in Nature Nanotechnology Vol. 3 Oct. 2008.

This component comprises a single nanotube 121 covered by two electrodes 131 and 132 forming the source and the drain of a field-effect transistor (FET), the gate of which is produced by a third electrode 133 formed by an underlying layer of $p^+$ doped silicon.

An injection of current into the nanotube causes an electroluminescence which is amplified by a microcavity 150 based on a mirror of silver 101 deposited on the third electrode 133. This microcavity comprises on either side of the nanotube a layer of silica 102 and a layer of PMMA 103, surmounted by a mirror of gold 104.

This amplification provides a light flux 19 directed upwards in the figure, in a direction A19 perpendicular to the plane of the different layers of the component.

Although not described in the state of the art, the upwards output direction of this light flux 19 makes it necessary to be able to collect it in this direction A19 in order to be able to inject it into a hypothetic linear optical guide 11 (in dotted lines). This injection can for example make it necessary to arrange this linear guide perpendicular to the layers of the component so as to have its input face 110 parallel to the output surface 104 of the cavity 150.

It is clearly understood that this constraint can constitute a source of complexity in the design of an integrated circuit, and limit compactness while increasing manufacturing complexity, among other possible problems.

DESCRIPTION OF THE INVENTION WITH REFERENCE TO THE FIGURES

The inventors demonstrated that it was possible to obtain an optical gain in a thin layer based on carbon nanotubes which is the first step in order to obtain a laser effect. For the modulation, the Kerr effect and the Stark effect can be exploited whilst, for the detection, it is possible to use the nanotubes as an absorption medium. In particular, obtaining a coupling between the nanotubes and the silicon makes it possible to establish the feasibility within an integrated component of such an optical link between several electronic assemblies.

Figure 2:
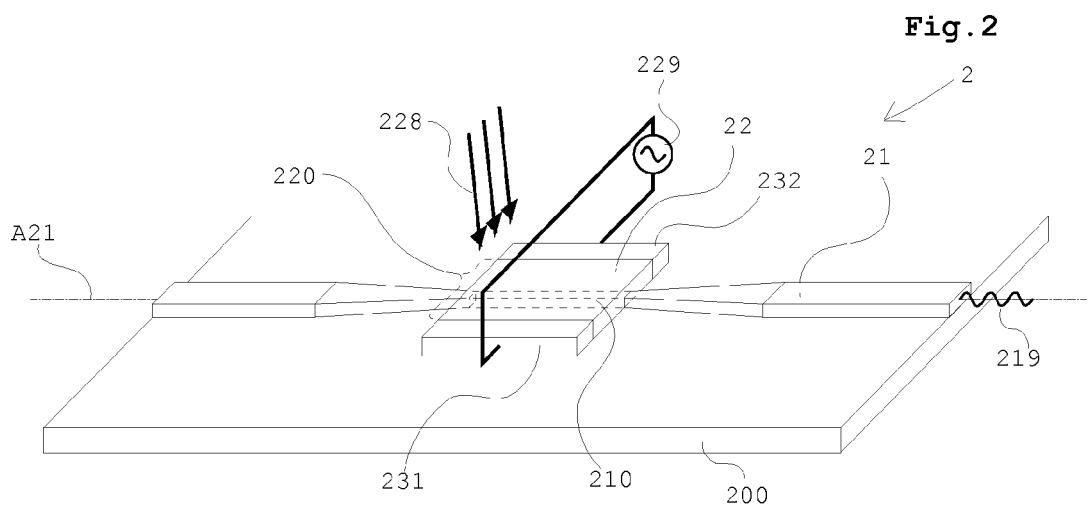
FIG. 2 is a diagrammatic perspective view illustrating according to the invention an example of a configuration for an optical coupling between a volume of nanotubes and an optical guide.
Figure 3:
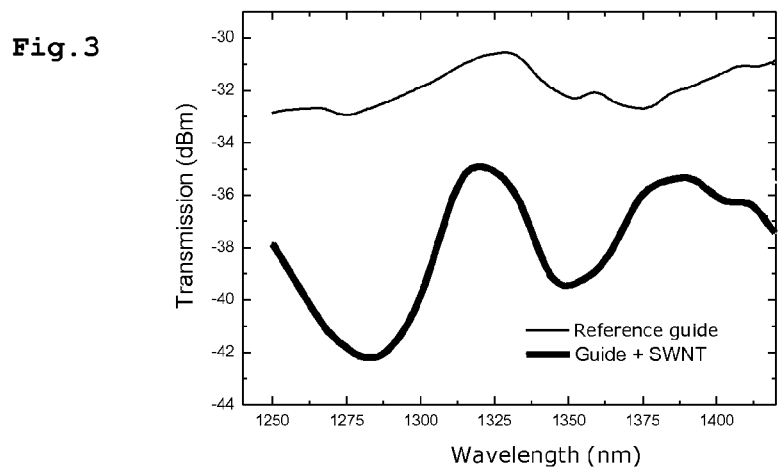
FIG. 3 is a graph illustrating test results demonstrating the optical coupling obtained in the configuration of FIG. 2.

FIG. 2 and FIG. 3 illustrate the experimentation with this coupling, and thus present a first result of the silicon/nanotubes integration.

The nanotubes are thus considered as an active medium and can be inserted into waveguides made of silicon, or polymer or any other semiconductor or dielectric materials.

FIG. 2 illustrates a configuration example for an optical coupling between a volume of nanotubes and an optical guide according to the invention.

This component 2 thus comprises a linear optical waveguide 21 on a support or substrate 200, and an active portion 210 of which is surrounded over part of its periphery by a group 22 of one or more essentially semiconducting nanotubes. These nanotubes interact with their external environment in an active zone 220 extending on either side of this active portion 210 of the optical waveguide.

In the case of an interaction by a signal or a light flux, the application for example of a light flux 228 to the nanotubes in the group 22 causes them to emit by optoluminescence a light flux 219 within the active part 210, along the longitudinal axis A21 of the guide. An optical-optical coupling is thus produced between the light flux received 228 and the light flux 219 propagating in the guide.

For an electrical interaction, for example by an electrical signal 229 received or applied by the electrodes 231 and 232, the nanotubes of the group 22 detect or emit or modify by electroluminescence a light flux 219 within the active part 210, along the longitudinal axis A21 of the guide.

It should be noted that the configuration illustrated in FIG. 2 does not specify the position of the nanotubes within the group 22, and can therefore be considered as an illustration of an aligned as well as a non-aligned embodiment.

FIG. 3 is a graph illustrating test results demonstrating the optical coupling obtained in the configuration of FIG. 2.

This coupling was obtained by absorption of the nanotubes in the group 22 under the effect of excitation by an incident light flux 228.

The graph represents the transmission spectrum of the waveguide 21. The differences in level found relative to a non-coupled reference guide demonstrate the interaction of the light with the tubes, and therefore the coupling obtained by the arrangement of the nanotubes in the group 22 around the optical guide 21.

Examples of Embodiments of Electro-Optical Components

In the examples illustrated in FIG. 2, FIG. 4, FIG. 5, FIG. 6 and FIG. 8, the electrical signal 229 is applied or detected by at least two electrodes 231, 232 and 431 and 432 situated around the active portion 210 and on either side of the optical waveguide 21, so as to generate between them an electric field, or generate or detect an electric current, substantially transversal to the longitudinal axis A21 of the optical guide 21. Typically, these electrodes are parallel to each other and to the longitudinal axis of the optical guide.

Figure 7:
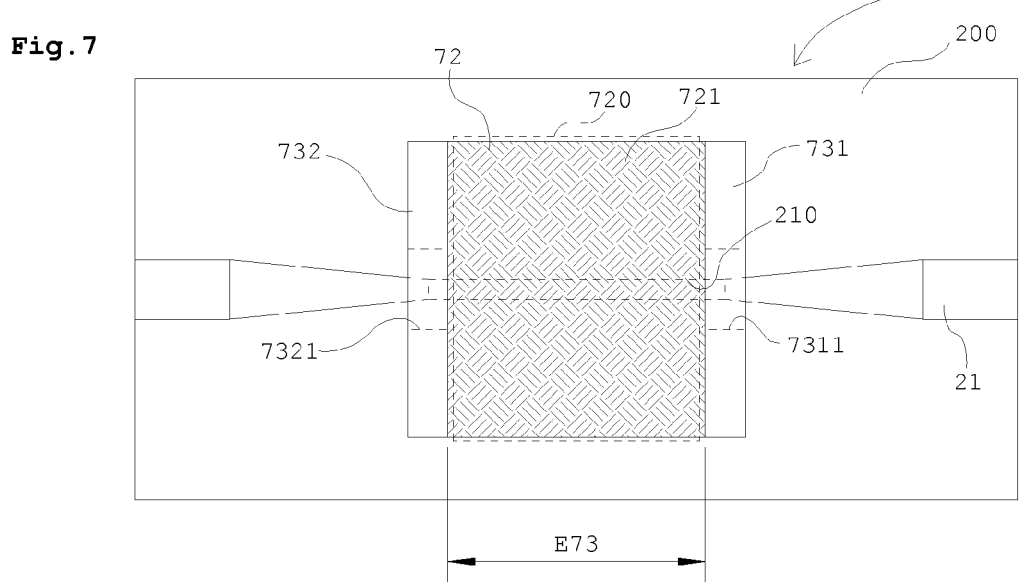
FIG. 7 is a diagrammatic top view of a configuration similar to FIG. 2 but with electrodes transversal to the guide, in an embodiment with multiple non-connected nanotubes performing a modulator function.

FIG. 7 represents a configuration in which two electrodes 731, 732 are arranged around the active region 720 so as to have between them a gap E73 extending along the optical waveguide 21, and so as thus to generate between them an electric field or an electric current substantially parallel to the longitudinal axis A21 of this optical guide. Typically, these electrodes are parallel to each other and transversal to the longitudinal axis of the optical guide.

Where they cross the optical guide 21, the two electrodes 731 and 732 can have a recess 7311, 7321 in their lower part, or even throughout their entire height in order to separate each of them into two semi-electrodes, so as to avoid the metal of the electrode being too close to the outer surface of the guide and risking preventing the transmission of light within the latter.

Figure 4:
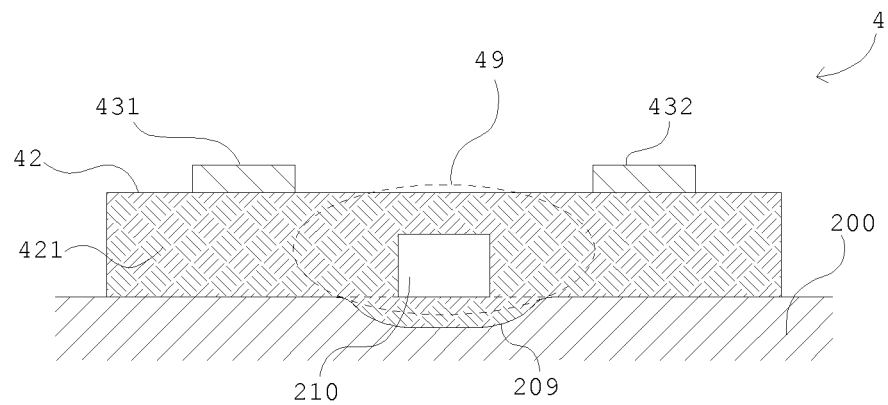
FIG. 4 is a diagrammatic cross-sectional view in a configuration similar to FIG. 2 but with electrodes on the top, in an embodiment with multiple non-aligned nanotubes and envelopment, performing a modulator function.
Figure 5:
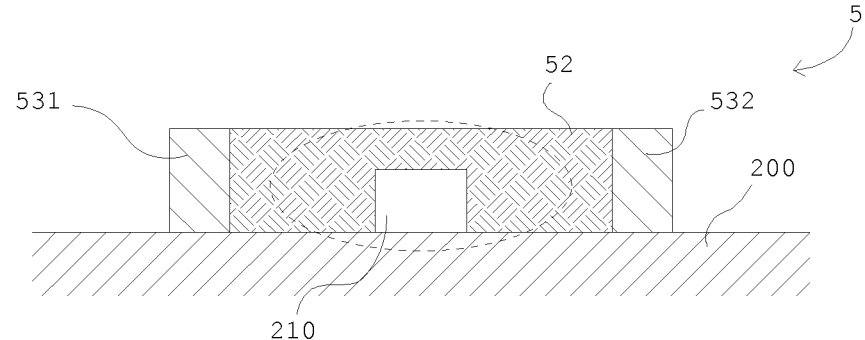
FIG. 5 is a diagrammatic cross-sectional view in the configuration of FIG. 2, in an embodiment with multiple non-aligned nanotubes, performing a modulator function.

FIG. 4, FIG. 5 and FIG. 7 illustrate non-aligned and non-connected embodiments, typically for a modulator type function, i.e. the nanotubes in groups 42, 52, 72 are not connected to the electrodes 231, 232 and 431, 432, and 731, 732.

They are deposited in a disordered manner and are not aligned with each other, nor with their environment. This is the reason why the group of nanotubes is represented with uniform alternating hatching which in no way presumes the position of the nanotube or nanotubes within this group.

In this component 4, 5 and 7 the groups 42, 52, 72 of nanotubes forms between the electrodes 431, 432, 531, 532, 731, 732 a substantially plane layer enclosing the active portion 210 of the optical waveguide 21, or in contact with the latter. The electrodes interact with the nanotubes in groups 42, 52, 72 by creating an electric field which causes a Kerr effect and/or a Stark effect within said nanotubes. This effect produces a modulation of a light flux circulating in the active portion 210 of the optical waveguide, as a function of a voltage or of an electrical signal 229 applied to the electrodes.

This modulation can be obtained in intensity, for example by the electro-absorption phenomenon. It can also be obtained in phase modulation by a Kerr electro-refraction effect, and/or in absorption shift by a Stark effect of the absorption peak shift in the active portion of the optical waveguide. The active portion is for example introduced into an interferometer (Mach Zehnder, resonator) in order to convert the phase modulation or absorption shift to intensity modulation.

For the electro-refraction use, the active region can be introduced into an interferometer (for example Mach Zehnder or resonator) in order to convert the phase modulation (electro-refraction) to intensity modulation.

The configuration of FIG. 5 is that of FIG. 2, with two electrodes 531 and 532 attached to the substrate 200 on the sides of the group 52 and at the same level as the latter. This arrangement can be carried out for example in the following order: guide 210, followed by: either nanotubes 52 then electrodes 531 and 532, or electrodes then nanotubes.

FIG. 4 represents a similar configuration, but where the electrodes 431, 432 are deposited on top of the group 42 of nanotubes. This structure is facilitated by the fact that the electrodes are not connected to the nanotubes. It can be advantageous for example because it makes it possible to deposit these electrodes without having to cut the sides of the group 42. This simplifies the production and allows a better density when several components are produced close to each other, and/or on the same nanotube layer as described below with reference to FIG. 12. This arrangement can be carried out for example in the following order: guide 210 then underetching 209 then nanotubes 42 then electrodes 431, 432.

Figure 6A:
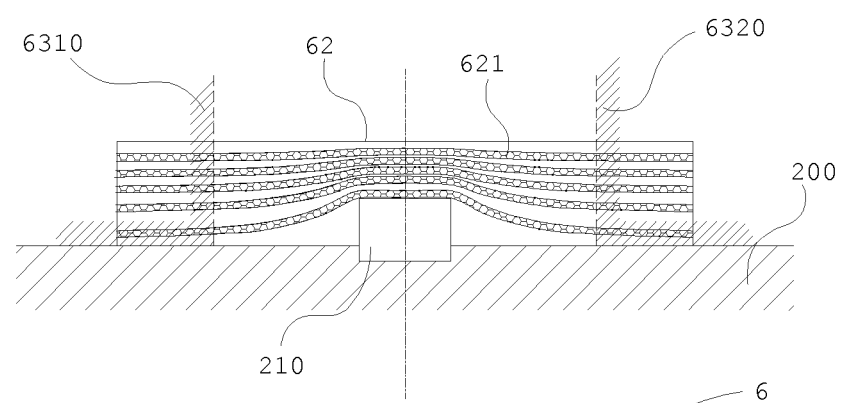
FIG. 6a, FIG. 6b are diagrammatic cross-sectional views and FIG. 6c a top view, in the configuration of FIG. 2, in an embodiment with multiple connected nanotubes performing a detector or emitter function, respectively before and after the operations of etching of the volume of nanotubes and deposition of the electrodes.
Figure 6B:
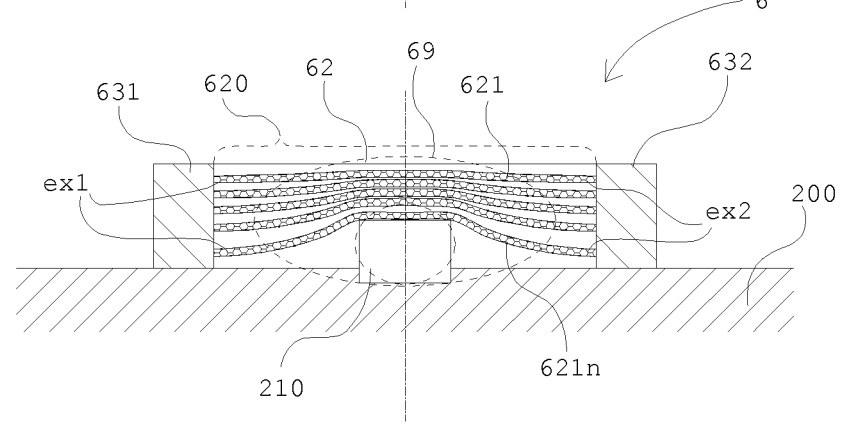
Figure 6C:
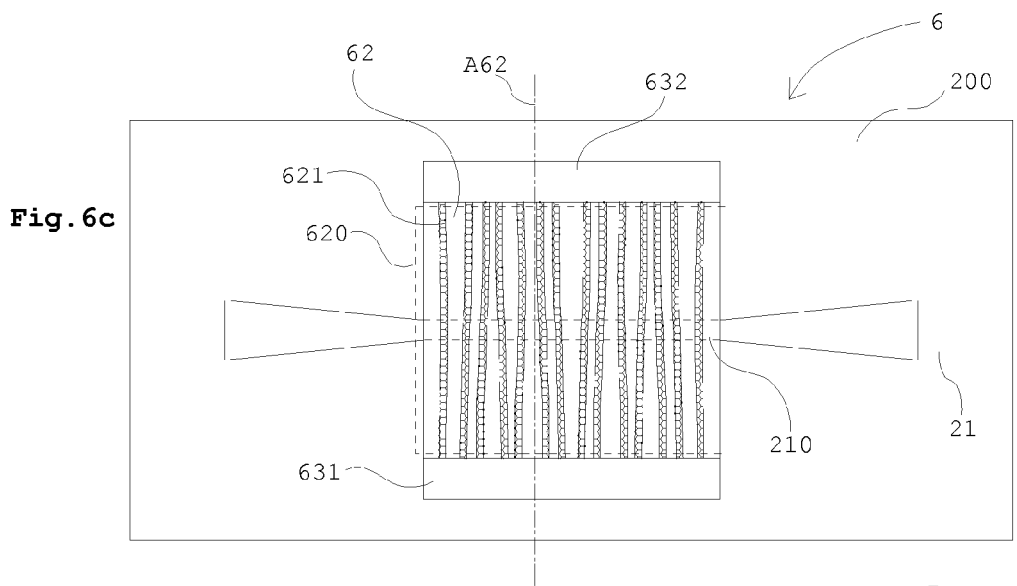
Figure 8:
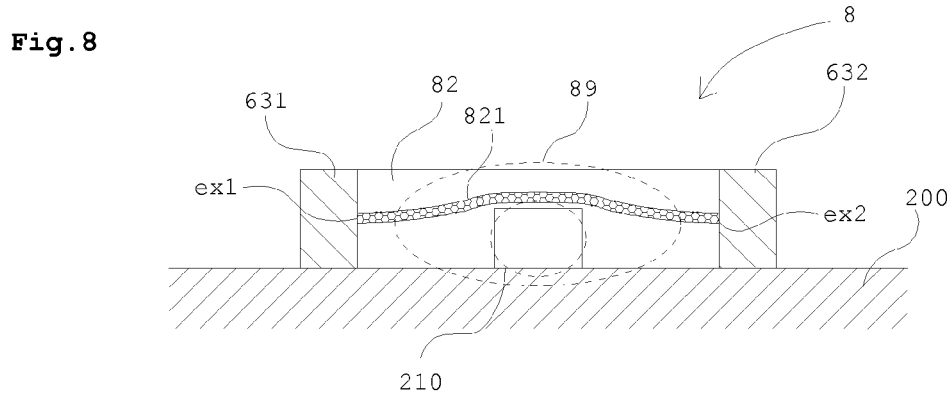
FIG. 8 is a diagrammatic cross-sectional view in the configuration of FIG. 2, in an embodiment with a single connected nanotube, performing a detector or emitter function.

FIG. 6 and FIG. 8 illustrate so-called aligned and connected embodiments, typically for a source- or detector-type function.

In this component 6, 8 the group of nanotubes 62, 82 forms between the electrodes 631, 632, 831, 832 a substantially plane layer enclosing the active portion 210 of the optical waveguide 21, or in contact with the latter. In this group, a so-called alignment zone enclosing the active portion 210 of the optical guide 21 and corresponding here to the whole of the active zone 620 has been produced. In this alignment zone, the nanotubes in the group of nanotubes 62, 82 are mostly aligned in a same direction A62 and A82 respectively.

Most of the nanotubes 621 to 621n and 821 in the alignment zone are each connected to the two electrodes 631, 632, 831, 832.

As can be seen in FIG. 6a, the group of nanotubes is first deposited then aligned. The external regions 6310 and 6320 of this group situated on each side of the alignment direction A62 are then cut, for example by chemical etching or with a laser. The electrodes are then deposited in these regions, so that they come into electrical contact with the corresponding ends ex1 and ex2 of all the nanotubes 621 to 621n of the active zone 620.

The component 6, 8 thus obtained can then be used as a light source or a detector, or even both at different times.

Figure 9:
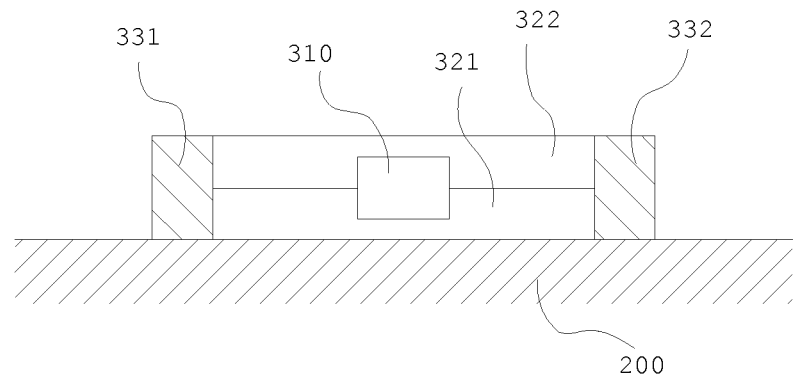
FIG. 9, FIG. 10 and FIG. 11 are diagrammatic cross-sectional views of a configuration of the type of that of FIG. 2, illustrating different possible geometries of the coupling between a volume of nanotubes and one or more optical guides.
Figure 10:
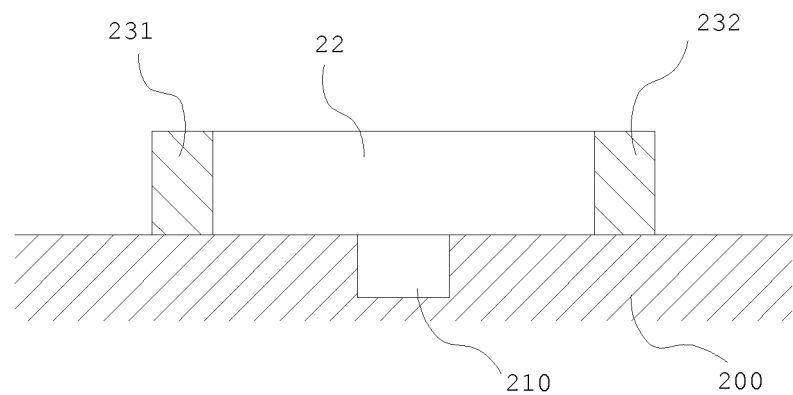
Figure 11:
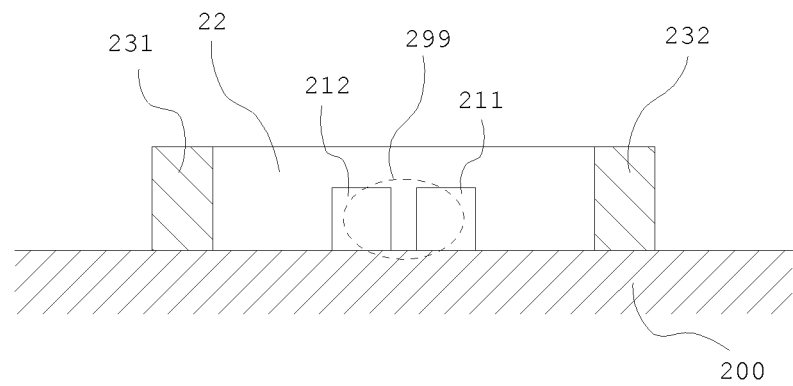

In addition to the figures previously described, FIG. 9 to FIG. 11 represent different examples of possible arrangements of the group of nanotubes with respect to the optical guide. These arrangements can be combined with the different embodiments of the invention described here.

In FIG. 4, an underetching of the support or substrate 200 under the active part 210 of the guide makes it possible to release a space 209 increasing its envelopment underneath.

In FIG. 6, the active part 210 of the guide is partially embedded in the support or substrate 200 which receives the nanotubes 62 and the electrodes 631, 632.

In FIG. 9, the active part 310 of the optical guide is arranged between two layers 321 and 322 of nanotubes which are surrounded by and possibly connected to two electrodes 331 and 332. This arrangement can be carried out for example in the following order: nanotubes 321 then guide 310 then nanotubes 322.

In FIG. 10, the optical guide 210 is completely sunk into the support or substrate 200, and is simply covered by the group of nanotubes 22.

As illustrated in FIG. 11, all these components can also comprise several active optical guide parts 211 and 212, in this case two, coupled 299 to each other by their proximity and coupled together with the group 22 of nanotubes.

Embodiment Examples of Optical Electronic Hybrid Integrated Circuits

Figure 12:
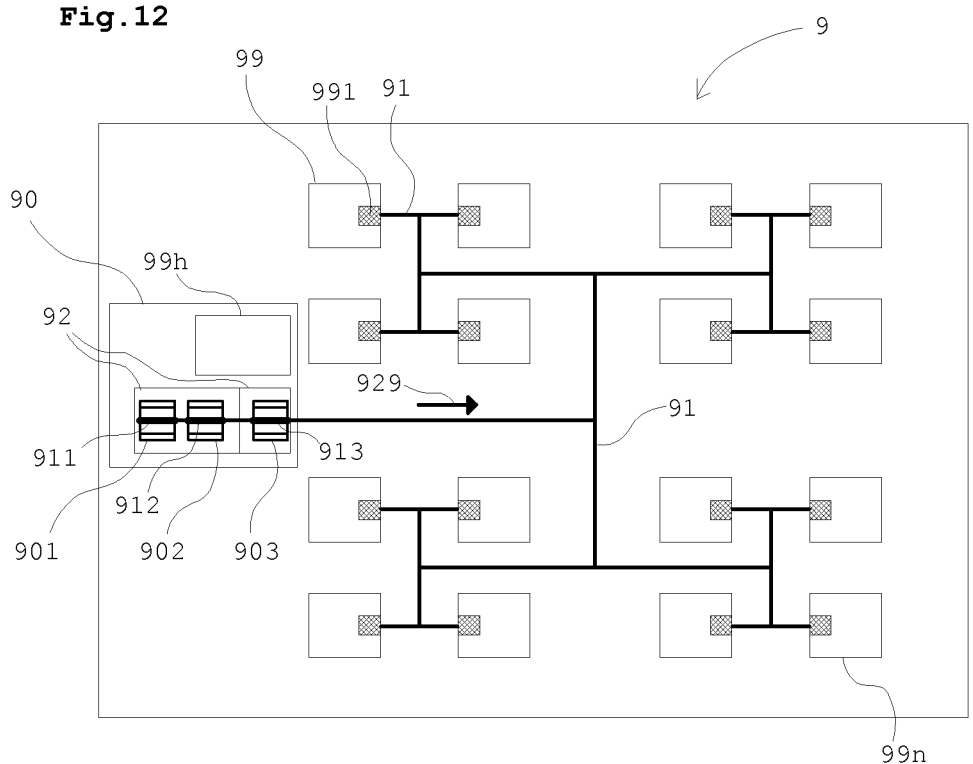
FIG. 12 is a schematic top-view diagram of an embodiment example of an integrated circuit comprising both an optical integrated circuit and an electronic integrated circuit.

FIG. 12 illustrates an embodiment example of the invention comprising a hybrid integrated circuit 9 with an integrated internal optical link.

This circuit comprises a plurality of electronic assemblies, including the assemblies 99h and respectively 99, each comprising and using at least one electro-optical component according to the invention, including the components 901, 902, 903, and 991 respectively, for communicating with each other by optical signals 929.

More precisely, this figure shows such a circuit with an optical link arranged to carry out an optical distribution of the clock signal. This optical signal 929 originates from a hybrid optical clock signal emission assembly 90 which constitutes a hybrid integrated circuit itself enclosed within the general hybrid integrated circuit 900.

In this hybrid emission assembly 90, a nanotube electro-optical emitter 901 according to the invention, for example as illustrated in FIG. 6 or FIG. 8, generates a light flux in an optical guide part 911, and thus constitutes a light source.

A nanotube electro-optical detector 902 according to the invention is produced in the same aligned zone of the same group 92 of nanotubes, for example as illustrated in FIG. 6 or FIG. 8, and controls the intensity or the wavelength of the light flux in an optical guide part 912 downstream of the source 901.

A nanotube electro-optical modulator 903 according to the invention, for example as illustrated in FIG. 4, FIG. 5 or FIG. 7, is produced in a non-aligned part of a sheet forming the same group 92 of nanotubes, and receives in its active optical guide part 913 the light flux originating from the source 901. This modulator 903 also receives an electric clock signal from an electronic clock block 99h itself integrated in the hybrid clock assembly 90. Based on this electric clock signal, the modulator 903 modulates the flux originating from the source 901 in order to produce an optical clock signal 929. This optical signal is distributed in the general circuit 900 by the optical circuit 91.

The different electronic assemblies 99 to 99n of this circuit 900 all use a clock signal distributed by an integrated optical circuit 91 in the form of an optical signal 929. This signal is received by each of these electronic assemblies through an electro-optical receiver 991 according to the invention, for example as illustrated in FIG. 6 or FIG. 8.

It can be seen that the invention thus makes it possible to produce a rapid optical link integrated within the general component 900, by integrating the various necessary elements in monolithic manner, in the same chip 900.

It can thus be seen that the integrated optical and electronic circuit 900 comprises an optical circuit 91 and a plurality of electronic circuits 99h and 99 to 99n respectively. These electronic circuits interact with each other through at least one electro-optical component 901, 902, 903 and 991 respectively according to the invention, which are integrated both in this optical circuit 91 and in these different electronic circuits 99h and 99 to 99n respectively.

Thus, each of these electro-optical components 901, 902, 903, and 991 respectively is integrated both in an electronic circuit 90 and in an integrated optical circuit 91, which integrated electronic and optical circuits interact with each other through it.

Of course, the invention is not limited to the examples which have just been described, and numerous adjustments can be made to these examples without exceeding the scope of the invention.

The invention claimed is:

1. A photonic component comprising: at least one linear optical waveguide made of silicon or silicon nitride an integrated portion of which, called an active portion, is surrounded over all or part of its periphery by a group of one or more essentially semiconducting deposited nanotubes which interact electrically, in so-called active zone extending on either side of said active portion of the optical waveguide, with at least two electrodes arranged on either side of said active portion, thus inducing an electro-optical coupling
   from an electrical signal applied between said electrodes, and
   toward producing an optical signal emitted or modified in said active portion of the optical waveguide towards the remainder of said optical waveguide.

2. The component according to claim 1, characterized in that the optical waveguide comprises, in its active portion, an optical light signal amplification structure.

3. The component according to claim 1, characterized in that the electrical signal is applied by at least two electrodes situated around the active portion and on either side of the optical waveguide, so as to generate between them an electric field or current substantially transversal to the longitudinal axis of the optical guide.

4. The component according to claim 1, characterized in that the electrodes interact with the nanotubes of the group without electrical connection, by creating an electric field which causes within said nanotubes a Kerr effect and/or a Stark effect and/or an electro-absorption carrying out a modulation of a light flux circulating in the active portion of the optical waveguide, as a function of a voltage or of an electrical signal applied to the electrodes.

5. The component according to claim 1, characterized in that, in a so-called alignment zone including the active portion of the optical guide and all or part of the active zone, the nanotubes of the group of nanotubes are mostly aligned in a same direction.

6. The component according to claim 5, characterized in that most of the nanotubes in the alignment zone are each connected to the two electrodes, the application to said electrodes of a voltage or of an electrical signal thus creating in said connected nanotubes an injection of charge carriers causing, by the phenomenon of electroluminescence, emission of a light flux within an optical mode which includes all or part of the active portion of the optical waveguide, creating from the signal or voltage applied to the electrodes a light flux in the optical waveguide and thus producing a light source for said optical guide.

7. The component according to claim 1, characterized in that the electrical signal applied or detected within the group of nanotubes is a bipolar signal.

8. The component according to claim 1, wherein the group of nanotubes comprises a plurality of nanotubes.

9. The component according to claim 1, characterized in that it comprises a plurality of optical waveguides, completely or partly coated with nanotubes within the same group of nanotubes;
said optical waveguides interacting independently of each other, each with at least two electrodes, said electrodes determining a plurality of independent active zones;
thus producing a plurality of components, said components being functionally independent of each other while using the same group of nanotubes.

10. The component according to claim 1, characterized in that it is integrated in both an electronic circuit and in an integrated optical circuit, said integrated electronic and optical circuits interacting with each other through said electro-optical component.

11. An integrated electronic and optical circuit comprising: at least one optical circuit and at least one electronic circuit, interacting with each other through at least one electro-optical component according to claim 1, said electro-optical component being integrated in both said optical circuit and in said electronic circuit.

12. The circuit according to claim 11, characterized in that it comprises a plurality of electronic assemblies each comprising and using at least one optical-optical or electro-optical component in order to communicate with each other by optical signals.

13. A method for producing an electro-optical component or circuit according to claim 1, comprising, for producing a coupling between at least one optical waveguide and one or more nanotubes, at least:
depositing a group of one or more nanotubes onto or around, at least one optical waveguide portion and interacting electrically with at least two electrodes situated on either side of said optical waveguide portion; or
creating at least one optical waveguide portion completely or partly surrounded by at least one region forming a group of one or more deposited nanotubes that interact electrically with at least two electrodes situated on either side of said optical waveguide portion; or
a combination of these two operations.

14. The method according to claim 13, characterized in that the creation operation comprises the following steps:
etching or deposition forming at least one optical guide made of silicon or silicon nitride;
deposition of a region forming a group of one or more semiconductor-type nanotubes surrounding all or part of the periphery of at least one so-called active portion of said optical waveguide;
etching or deposition of electrodes surrounding on either side said active portion of the optical waveguide and arranged to interact electrically with the nanotubes surrounding said active portion.

15. The method according to claim 13, characterized in that it also comprises, between a step of deposition of nanotubes and a step of creation of the electrodes:
a step of etching or cutting of said group of nanotubes in two cutting regions distributed on either side of the active portion of the optical waveguide, said cutting regions being arranged to cut a same plurality of nanotubes within said group;
the step of creation of the electrodes comprising a deposition or a growth of said electrodes within said cutting regions, so as to electrically connect said electrodes to both ends of a same plurality of nanotubes in the group of nanotubes.

16. The method for producing an electro-optical component according to claim 13, characterized in that the creation operation comprises the following steps:
etching or deposition, on the one hand, of material forming at least one optical guide made of silicon or silicon nitride, and on the other hand of electrodes surrounding on either side a so-called active portion of the optical waveguide;
deposition of a group of semiconductor-type nanotubes coating all or part of the periphery of at least said active portion of said optical waveguide and arranged to interact electrically with said electrodes.

17. The method according to claim 13, characterized in that it also comprises a step of underetching of the substrate or of the layer situated under the optical waveguide, carried out at the level of the active portion so as to allow the group of nanotubes to coat the lower part of said optical waveguide.

18. The method according to claim 16, characterized in that it comprises a step of producing at least one monobloc region forming a group of nanotubes, followed by one or more operations of producing a plurality of components, functionally independent and produced within the same group of nanotubes.

19. The method according to claim 13, characterized in that it comprises a control of the optical wavelength of the optical or electro-optical coupling by the choice of the winding index of the nanotubes of the coupling.

20. A method for producing an optoelectronic hybrid integrated circuit comprising on the one hand a production of at least one electronic circuit and on the other hand a production of at least one optical circuit within the same integrated circuit, characterized in that it also comprises at least one step of producing at least one electro-optical component according to claim 13 integrated in both said electronic circuit and said optical circuit.

* * * * *